(12) United States Patent
Kim et al.

(10) Patent No.: US 9,142,481 B2
(45) Date of Patent: Sep. 22, 2015

(54) INTEGRATED CIRCUIT PACKAGING SYSTEM WITH HEATSINK CAP AND METHOD OF MANUFACTURE THEREOF

(75) Inventors: Gwangjin Kim, Icheon-si (KR); JoungIn Yang, Seoul (KR); DokOk Yu, Seoul (KR); Hoon Jung, Icheon-si (KR); Jae Han Chung, Ichon-si (KR)

(73) Assignee: STATS ChipPAC Ltd., Singapore (SG)

( * ) Notice: Subject to any disclaimer, the term of this patent is extended or adjusted under 35 U.S.C. 154(b) by 358 days.

(21) Appl. No.: 13/489,282

(22) Filed: Jun. 5, 2012

(65) Prior Publication Data
US 2013/0322023 A1    Dec. 5, 2013

(51) Int. Cl.
*H05K 7/20* (2006.01)
*H01L 23/433* (2006.01)
*H01L 23/498* (2006.01)
*H01L 23/42* (2006.01)

(52) U.S. Cl.
CPC ............ *H01L 23/4334* (2013.01); *H01L 23/42* (2013.01); *H01L 23/49816* (2013.01); *H01L 2224/16225* (2013.01); *H01L 2224/73253* (2013.01); *H01L 2224/92225* (2013.01); *H01L 2924/15311* (2013.01); *H01L 2924/1815* (2013.01); *H01L 2924/18161* (2013.01); *Y10T 29/49155* (2015.01)

(58) Field of Classification Search
USPC ................. 361/675–678, 688–723, 752, 760, 361/829–831
See application file for complete search history.

(56) References Cited

U.S. PATENT DOCUMENTS

| | | | |
|---|---|---|---|
| 5,208,732 A * | 5/1993 | Baudouin et al. ............. | 361/704 |
| 5,402,313 A * | 3/1995 | Casperson et al. ............. | 361/710 |
| 5,621,615 A * | 4/1997 | Dawson et al. ................ | 361/704 |
| 5,981,310 A | 11/1999 | DiGiacomo et al. | |
| 6,483,708 B2 * | 11/2002 | Ali et al. ........................ | 361/719 |
| 6,486,562 B1 | 11/2002 | Kato | |
| 6,534,859 B1 | 3/2003 | Shim et al. | |
| 6,892,453 B2 | 5/2005 | Farnworth | |
| 7,186,585 B2 | 3/2007 | Bish et al. | |
| 7,518,219 B2 | 4/2009 | Bish et al. | |
| 8,018,034 B2 | 9/2011 | Chi et al. | |
| 2004/0218372 A1 * | 11/2004 | Hamasaki et al. ............. | 361/767 |
| 2005/0174744 A1 * | 8/2005 | Zheng ........................... | 361/760 |

* cited by examiner

*Primary Examiner* — Courtney Smith
(74) *Attorney, Agent, or Firm* — Ishimaru & Associates LLP

(57) ABSTRACT

A method of manufacture of an integrated circuit packaging system includes: providing a substrate; attaching an integrated circuit to the substrate; molding an encapsulation directly on the integrated circuit and the substrate; forming a trench in the encapsulation having a trench bottom surface and surrounding the integrated circuit; and mounting a heatsink having a heatsink rim over the integrated circuit with the heatsink rim within the trench and the heatsink electrically isolated from the substrate.

9 Claims, 5 Drawing Sheets

INTEGRATED CIRCUIT PACKAGING SYSTEM WITH HEATSINK CAP AND METHOD OF MANUFACTURE THEREOF

TECHNICAL FIELD

The present invention relates generally to an integrated circuit packaging system, and more particularly to a system having a heatsink.

BACKGROUND ART

The electronic industry continues to seek products that are lighter, faster, smaller, multi-functional, more reliable, and more cost-effective. The advent of multi-function electronic devices, such as cell phones that are also game platforms, cameras, Internet portals, and music or video players, has brought immense pressure on the electronics device manufacturers and the manufacturing companies that support them.

In an effort to meet such requirements, package assembly techniques have been developed for smaller packages. These types of packages can combine two or more semiconductor chips in a single package, thereby realizing increased memory density, multi-functionality, and/or reduced package footprint.

As integration increases while package sizes decreases, adverse interactions within the package and external to the package can affect the functionality of circuits in the package. Heat or radiation can affect the internal circuits.

Thus, a need still remains for an integrated circuit packaging system for increasing integration, decrease size, and increased reliability. In view of the challenges of balancing all these needs, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate; attaching an integrated circuit to the substrate; molding an encapsulation directly on the integrated circuit and the substrate; forming a trench in the encapsulation having a trench bottom surface and surrounding the integrated circuit; and mounting a heatsink having a heatsink rim over the integrated circuit with the heatsink rim within the trench and the heatsink electrically isolated from the substrate.

The present invention provides an integrated circuit packaging system including: a substrate; an integrated circuit attached to the substrate; an encapsulation molded directly on the integrated circuit and the substrate with the encapsulation having a trench with a trench bottom surface and the trench surrounding the integrated circuit; and a heatsink having a heatsink rim mounted over the integrated circuit with the heatsink rim within the trench.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
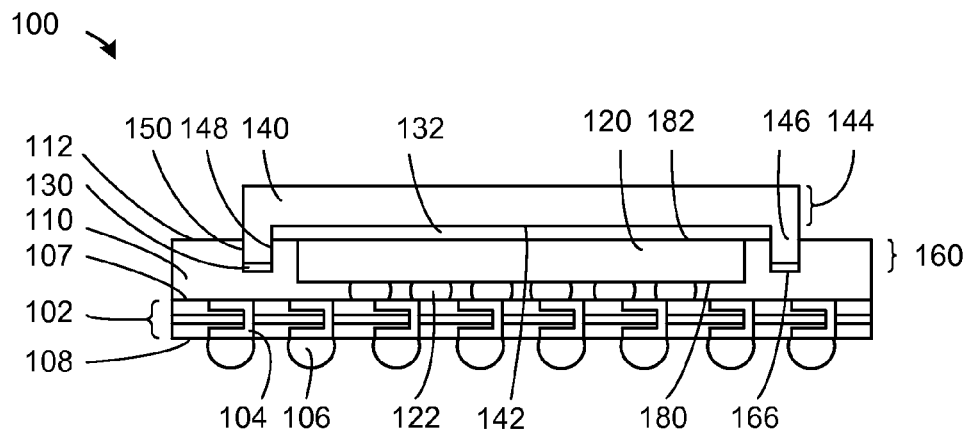
FIG. 1 is a cross-sectional view of the integrated circuit packaging system along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

The term "active side" refers to a side of a die, a module, a package, or an electronic structure having bond pads for forming electrical connections to the next level components. The term "processing" as used herein includes deposition of material or photoresist, patterning, exposure, development, etching, cleaning, and/or removal of the material or photoresist as required in forming a described structure.

For expository purposes, the term "horizontal" as used herein is defined as a plane parallel to the plane or surface of the active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements with no intervening element.

The term "processing" as used herein includes deposition of material or photoresist, patterning, exposure, development, etching, cleaning, and/or removal of the material or photoresist as required in forming a described structure.

Figure 2:
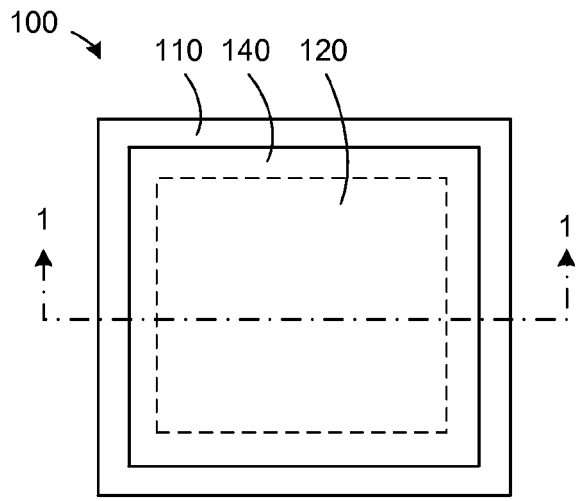
FIG. 2 is a top plan view of the integrated circuit packaging system.

Referring now to FIG. 1, therein is shown a cross-sectional view of the integrated circuit packaging system 100 along line 1-1 of FIG. 2 in a first embodiment of the present invention. The cross-sectional view can depict an integrated circuit 120 mounted on a substrate 102.

The substrate 102 can be a structure for mounting devices or components and for providing electrical conduction paths between these devices and components and to the external environment. Examples of the substrate 102 are a laminated substrate, a ceramic substrate, and a rigid planar structure with electrical conduction pathways.

The substrate 102 can include substrate interconnects 104 for providing electrical conduction paths between a substrate top side 107 and a substrate bottom side 108. The substrate interconnects 104 can include conductive traces, contact pads, bond pads, vias, leads, wires, or a combination thereof External interconnects 106 can be electrically connected to the substrate interconnects 104 of the substrate 102. The external interconnects 106 are electrically conductive structures to allow the integrated circuit packaging system 100 to connect to next level components.

The integrated circuit 120 can be mounted to the substrate 102. For example, the integrated circuit 120 can be mounted using a variety of techniques including a flip chip mounting, ball grid array mounting, or a combination thereof.

The integrated circuit 120 can be an active device having active circuitry therein. The integrated circuit 120 includes a device active side 180 and a device inactive side 182 on the opposite side of the integrated circuit 120 from the device active side 180. The device active side 180 of the integrated circuit 120 can face the substrate 102.

The integrated circuit 120 can be connected to the substrate interconnects 104 with device interconnects 122. The device interconnects 122 allow the integrated circuit 120 to connect electrically to the substrate 102. For example, the device interconnects 122 are electrically conductive structures for connecting the integrated circuit 120 to the substrate 102.

An encapsulation 110 can be formed on and over the integrated circuit 120 and the substrate 102. The encapsulation 110 can be a package cover providing a protective hermetic seal. The encapsulation 110 can be formed directly on the vertical sides of the integrated circuit 120, the device active side 180, the substrate top side 107, and the device interconnects 122.

The encapsulation 110 can expose the device inactive side 182 of the integrated circuit 120. The encapsulation 110 can include an encapsulation top side 112 on the side of the encapsulation 110 facing away from the substrate 102. The encapsulation top side 112 can be coplanar with the device inactive side 182 of the integrated circuit 120.

The encapsulation 110 can be formed using a variety of packaging techniques including transfer molding, injection molding, film assist molding, ceramic, glob top, B-stage, wire-in-film, or a combination thereof. For example, the encapsulation 110 can be formed using materials including an epoxy, a resin, a capillary underfill epoxy, ceramic, a non-conductive paste (NCP), or a combination thereof.

A heatsink 140 can be mounted over the integrated circuit 120. The heatsink 140 includes a heatsink body 144 and a heatsink rim 146 extending downward below the perimeter of the heatsink body 144. The heatsink 140 can include a heatsink inner surface 142 enclosed by the heatsink rim 146. The heatsink rim 146 can include an inner rim surface 148 and an outer rim surface 150.

The encapsulation 110 includes a trench 160 formed at the encapsulation top side 112 and surrounding a portion of the device inactive side 182 of the integrated circuit 120. The trench 160 can be formed with segments that are parallel with the non-horizontal sides of the integrated circuit 120.

The trench 160 can be formed partially through the encapsulation 110. The trench 160 can have a trench bottom surface 166 formed in the encapsulation 110.

The trench 160 can be formed in a variety of ways. For example, the trench 160 can be formed using laser etching. The trench 160 can be formed having a rectangular shape with no extraneous elements. The trench 160 formed by laser etching can have the characteristics of laser etching including the trench bottom surface 166 having an irregular surface produced by the ablative action of laser beam.

It has been discovered that forming the trench 160 using laser etching can increase package reliability by forming the trench 160 in a single operation. By forming the trench 160 as a single continuous structure, the heatsink 140 can be mounted in the trench 160 with the adhesive layer 130 forming a hermetic seal.

It has been discovered that forming the trench 160 using laser etching can increase package reliability and heat dissipation efficiency by forming the trench 160 in different shapes including a circle, oval, rectangle, trapezoid, star, or a combination thereof. By forming the trench 160 in different shapes using laser etching, the heatsink 140 can be configured to have increased surface area and have a higher heat dissipation rate.

In another example, the trench 160 can be formed using a saw (not shown). The trench 160 can be formed by making a series of intersecting linear cuts at the encapsulation top side 112 around the integrated circuit 120. The trench 160 formed by sawing can have the characteristics of sawing including the trench bottom surface 166 having an irregular surface or scratch marks made by the rotational action of the saw blade.

It has been discovered that forming the trench 160 using the saw to form intersecting linear cuts can increase package reliability by providing openings at the corners of the trench 160 for the adhesive layer 130 to flow from underneath the heatsink 140. Allowing the adhesive layer 130 to flow can equalize the air pressure underneath the heatsink 140.

It has been discovered that forming the trench 160 using the saw to form linear cuts can increase package reliability and increase production rates by providing faster formation of the trench 160. Using the saw to form multiple linear cuts across packages reduces error rates by forming the trench 160 uniformly with a multiple sawing operation.

In yet another example, the trench 160 can be formed during the molding of the encapsulation 110 by using a mold chase (not shown) having mold chase protrusions in the inverse shape of the trench 160. The trench 160 formed by molding can have the characteristics of molding including the trench bottom surface 166 having mold flashing or a molded surface based on the mold chase.

It has been discovered that forming the trench 160 by molding increase package reliability by forming the trench 160 using a mold chase. By forming the trench 160 as a single continuous structure, the heatsink 140 can be mounted in the trench 160 with the adhesive layer 130 without requiring additional processing such as etching, sawing, or similar processing techniques.

The heatsink rim 146 can be mounted in the trench 160. The trench 160 can have an adhesive layer 130 applied at the trench bottom surface 166. The adhesive layer 130 can be formed from an adhesive material for attaching the material of the heatsink rim 146 to the material of the trench 160. The adhesive layer 130 can form a continuous surface along the trench 160.

A thermal interface material layer 132 can be applied on the device inactive side 182 and the encapsulation top side 112 within the perimeter of the trench 160. The thermal interface material layer 132 can be formed from an electrically non-conductive material.

It has been discovered that mounting the heatsink rim 146 in the trench 160 provides increased manufacturing reliability. The heatsink rim 146 can act as a barrier to prevent the leaking of the thermal interface material layer 132 when the heatsink 140 can be mounted over the integrated circuit 120. Leaking can include overflow, bleed out, thinning of the bond line thickness (BLT), or a combination thereof It has been discovered that forming the trench 160 around the integrated circuit 120 and mounting the heatsink 140 in the trench 160 provides improved reliability and improved thermal dissipation. Mounting the heatsink 140 in the trench 160 aligns the heatsink 140 over the integrated circuit 120 to maximize the heat transfer from the integrated circuit 120 to the heatsink 140. Aligning the heatsink 140 with the trench 160 eliminates rotation and tilting alignment errors and increases the level of thermal dissipation.

It has been discovered that the heatsink 140 including the heatsink rim 146 provides increased surface area to transfer heat away from the integrated circuit 120 to the top surface of the heatsink 140, which is exposed to ambient or the open environment to dissipate heat. The heatsink 140 has a higher thermal conduction than the encapsulation 110 thereby improving the thermal management of the integrated circuit packaging system 100.

Referring now to FIG. 2, therein is shown a top plan view of the integrated circuit packaging system 100. The heatsink 140 can be aligned with the integrated circuit 120 to maximize the level of heat transferal from the integrated circuit 120 to the heatsink 140. The heatsink 140 is over the integrated circuit 120. The heatsink rim 146 of FIG. 1 is spaced away from the perimeter of the integrated circuit 120.

Figure 3:
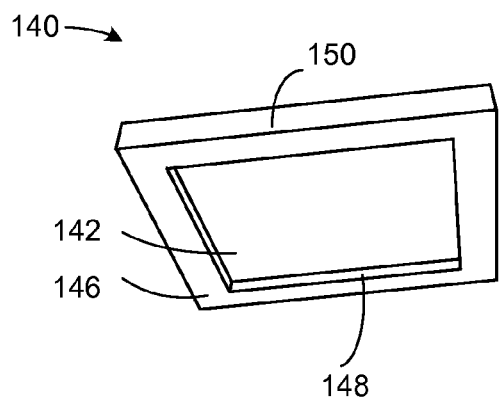
FIG. 3 is an isometric view of the heatsink.

Referring now to FIG. 3, therein is shown an isometric view of the heatsink 140. The heatsink 140 can include the heatsink inner surface 142 surrounded by the heatsink rim 146. The heatsink rim 146 can include the inner rim surface 148 and the outer rim surface 150. The heatsink rim 146 forms a continuous structure around the perimeter of the heatsink 140. The heatsink rim 146 can be sized to fit into the trench 160 of FIG. 1.

Figure 4:
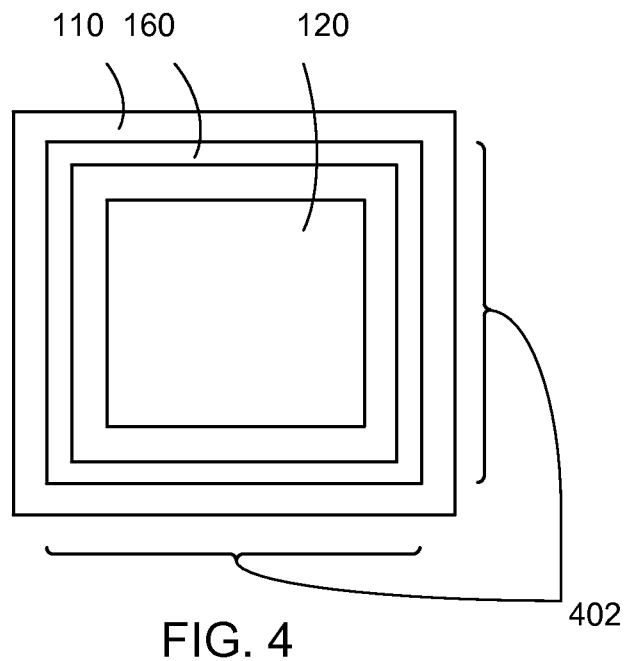
FIG. 4 is a top view of the encapsulation with the trench.

Referring now to FIG. 4, therein is shown a top view of the encapsulation 110 with the trench 160. The trench 160 can form a continuous rectangular channel on the encapsulation 110 surrounding the device inactive side 182 of FIG. 1 for mounting the heatsink rim 146 of FIG. 1. The trench 160 can include trench segments 402. For example, the trench segments 402 can be formed to be aligned with and substantially parallel to the horizontal sides of the integrated circuit 120.

The trench 160 can be formed using a laser etching process. The trench 160 can have the characteristics of being formed by laser etching. The trench bottom surface 166 of FIG. 1 can have laser etch marks. The trench bottom surface 166 can have laser etching debris as a result of the laser etching process. The trench 160 can have non-vertical side walls as a result of the laser etching process. The trench 160 can form a rounded rectangular channel based on forming the trench 160 using a laser having a round beam aperture.

The trench 160 can be formed using a molding process. The trench 160 can have the characteristics of being formed by molding. The trench bottom surface 166 can have a molded finish. The trench 160 can have vertical side walls as a result of the molding process. However it is understood that the trench 160 can have side walls that are non-vertical depending on the process used to form the trench.

It has been discovered that the trench 160 improves reliability by allowing the heatsink 140 of FIG. 1 to be mounted in the trench 160. The trench 160 provides a mechanical connection resistant to lateral movement because the heatsink rim 146 of FIG. 1 is within the trench 160.

Figure 5:
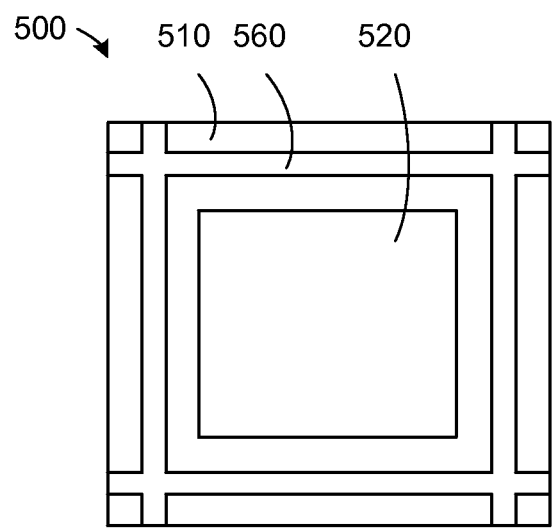
FIG. 5 is a top view of an encapsulation with a trench of the integrated circuit packaging system in a second embodiment of the present invention.

Referring now to FIG. 5, therein is shown a top view of an encapsulation 510 with a trench 560 of an integrated circuit packaging system 500 in a second embodiment of the present invention. The trench 560 can form a rectangular channel in an encapsulation top side 112 of FIG. 1 surrounding an integrated circuit 520. The integrated circuit packaging system 500 includes similar elements as in the first embodiment of the integrated circuit packaging system 100 of FIG. 1.

The trench 560 can be formed using a sawing process and have the characteristics of being formed by sawing. The trench bottom surface 166 of FIG. 1 can have an irregular surface from the action of the saw. For example, the irregular surface can include sawing scratch marks formed aligned with the direction of sawing. The trench bottom surface 166 can have uneven cutting marks, flashing, damage from debris at a blade tip, sawing residue or a combination thereof as a result of the sawing process. The trench 560 can have irregular, non-vertical side walls as a result of the sawing process based on irregularities of the spinning saw blade of the saw.

The rectangular channel in the encapsulation 510 can be formed by making several individual intersecting linear cuts in the encapsulation 510 using the saw. The combined cuts can form the trench 560 having the cuts extending beyond the corners of the rectangular channel of the trench 560.

It has been discovered that forming the trench 560 using intersecting linear cuts in the encapsulation 510 using a saw provides increased reliability by allowing the adhesive layer 130 of FIG. 1 to flow out from under the heatsink 140 of FIG. 1 as the heatsink rim 146 of FIG. 1 is mounted in the trench 560. Allowing the adhesive layer 130 to flow out can reduce air pressure under the heatsink 140.

Figure 6:
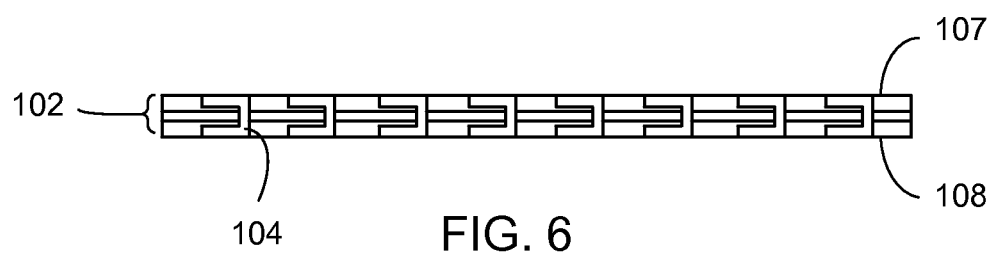
FIG. 6 is the structure of FIG. 1 in a provisioning phase of manufacture.

Referring now to FIG. 6, therein is shown the structure of FIG. 1 in a provisioning phase of manufacture. The provisioning phase can include providing the substrate 102 including the substrate interconnects 104. The substrate 102 can include the substrate top side 107 and a substrate bottom side 108.

Figure 7:
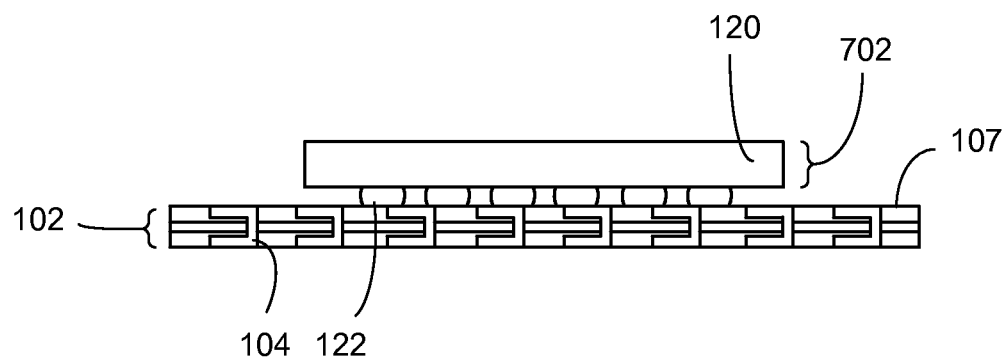
FIG. 7 is the structure of FIG. 1 in an attaching phase of manufacture.

Referring now to FIG. 7, therein is shown the structure of FIG. 1 in an attaching phase of manufacture. The attaching phase can include an attaching process to attaching the integrated circuit 120 over the substrate 102.

The device interconnects 122 can be attached directly to the substrate interconnects 104 to form an electrical connection between the integrated circuit 120 and the substrate 102. The integrated circuit 120 can include a flip chip package, a ball grid array package, or similar device. The integrated circuit 120 can be mounted with the device active side 180 of FIG. 1 facing the substrate top side 107.

The integrated circuit 120 can have a device height 702. In an illustrative example, the integrated circuit 120 can be mounted with the device active side 180 facing away from the substrate top side 107.

Figure 8:
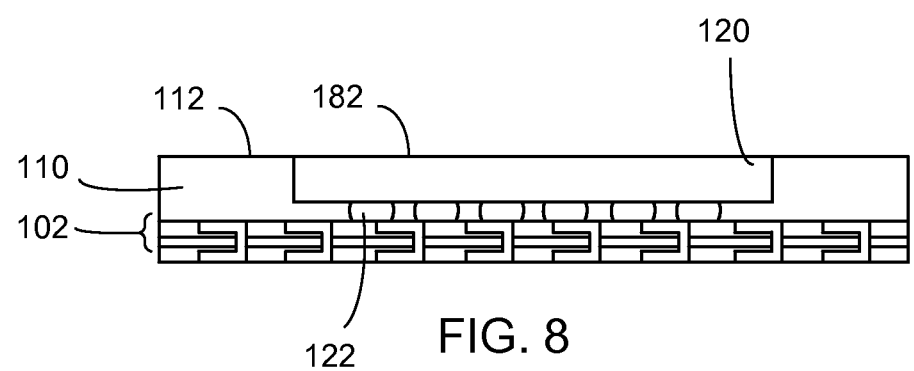
FIG. 8 is the structure of FIG. 1 in a molding phase of manufacture.

Referring now to FIG. 8, therein is shown the structure of FIG. 1 in a molding phase of manufacture. The molding phase can include a molding process for molding the encapsulation 110 on the integrated circuit 120, the substrate top side 107 of FIG. of the substrate 102, and the device interconnects 122.

The encapsulation 110 can expose the device inactive side 182 of the integrated circuit 120. The device inactive side 182 and the encapsulation top side 112 can be coplanar. In an illustrative example, the encapsulation 110 can expose a portion of the device active side 180 of FIG. 1.

Figure 9:
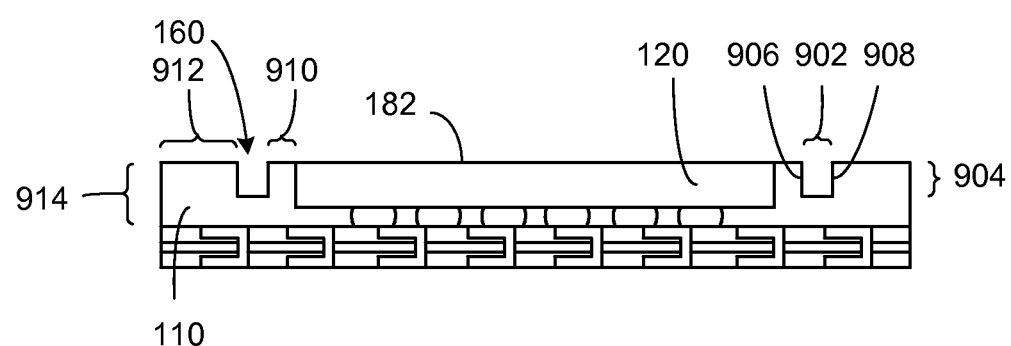
FIG. 9 is the structure of FIG. 1 in a forming phase of manufacture.

Referring now to FIG. 9, therein is shown the structure of FIG. 1 in a forming phase of manufacture. The forming phase can include a forming process for forming the trench 160 at the substrate top side 107 of FIG. 1.

The trench 160 can be formed in a variety of ways including laser etching, sawing, molding, or similar processes. For example, the trench 160 can be formed using laser etching to ablate the material of the encapsulation 110. The trench 160 formed by laser etching can have the characteristics of laser etching including the trench bottom surface 166 of FIG. 1 have ablation patterns from the laser beam.

In another example, the trench 160 can be formed using a saw. The trench 160 can be formed by making a series of intersecting linear cuts at the encapsulation top side 112 of FIG. 1 around the integrated circuit 120. The trench 160 formed by sawing can have the characteristics of sawing including the trench bottom surface 166 having scratch marks along the trench 160 made by the action of the saw blade.

In yet another example, the trench 160 can be formed during the molding of the encapsulation 110 by using a mold chase (not shown) having mold chase protrusions in the inverse shape of the trench 160. The trench 160 formed by molding can have the characteristics of molding including the trench bottom surface 166 having a smooth molded surface.

The trench 160 can have a trench depth 904 and a trench width 902. The trench 160 can be formed having a rectangular shape surrounding the device inactive side 182. The trench 160 can have a trench inner wall 906 and a trench outer wall 908 with the trench inner wall 906 between the device inactive side 182 and the trench outer wall 908. The trench width 902 can be the same width or larger than the width of the heatsink rim 146 of FIG. 1.

The trench 160 can be horizontally offset from the trench inner wall 906 by an encapsulation inner offset 910. The encapsulation 110 can extend away from the trench outer wall 908 by an encapsulation outer offset 912. For example, typical dimensions of the encapsulation inner offset 910 and the encapsulation outer offset 912 can be approximately 100 to 300 μm. However, it is understood that the encapsulation inner offset 910 and the encapsulation outer offset 912 can be larger or smaller based on the manufacturing techniques employed to form the trench 160.

The encapsulation 110 can have an encapsulation height 914. The trench 160 can be formed within the encapsulation 110 with the trench depth 904 less than the encapsulation height 914. The trench depth 904 can be less than the device height 702 of FIG. 7.

Figure 10:
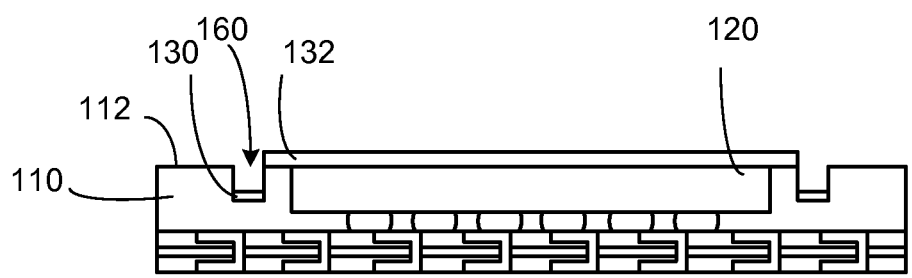
FIG. 10 is the structure of FIG. 1 in a layering phase of manufacture.

Referring now to FIG. 10, therein is shown the structure of FIG. 1 in a layering phase of manufacture. The layering phase can include a layering process for forming the adhesive layer 130 on the trench bottom surface 166 of FIG. 1 and forming the thermal interface material layer 132 on and over the device inactive side 182 of FIG. 1 and the portion of the encapsulation top side 112 between the trench 160 and the device inactive side 182.

The adhesive layer 130 can be for attaching the heatsink rim 146 of FIG. 1 to the trench bottom surface 166 of the encapsulation 110. The adhesive layer 130 can be formed with an electrically non-conductive material.

The thermal interface material layer 132 can be for facilitating the transfer of heat from the integrated circuit 120 to the heatsink 140 of FIG. 1. The thermal interface material layer 132 can be formed with an electrically non-conductive material that is thermally conductive.

In an illustrative example, the thermal interface material layer 132 can be formed directly on and over the device active side 180 of FIG. 1. The thermal interface material layer 132 can be formed directly on the integrated circuit 120 and be in direct contract with the heatsink 140.

It has been discovered that mounting the heatsink rim 146 in the trench 160 provides increased manufacturing reliability. The heatsink rim 146 can act as a barrier to prevent the migration of the thermal interface material layer 132 when the heatsink 140 is mounted over the integrated circuit 120.

Figure 11:
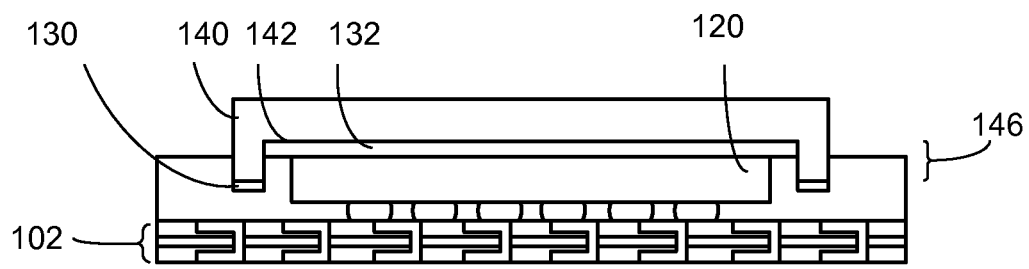
FIG. 11 is the structure of FIG. 1 in a mounting phase of manufacture.

Referring now to FIG. 11, therein is shown the structure of FIG. 1 in a mounting phase of manufacture. The mounting phase can include a mounting process for mounting the heatsink 140 over the integrated circuit 120 with the heatsink rim 146 in the trench 160 of FIG. 1 The heatsink rim 146 can be inserted into the trench 160 and attached to the trench bottom surface 166 of FIG. 1 with the adhesive layer 130.

The heatsink inner surface 142 can be attached to the device inactive side 182 of FIG. 1 with the thermal interface material layer 132. The thermal interface material layer 132 can be conduct heat from the integrated circuit 120 to the heatsink 140.

The heatsink 140 can include an aperture (not shown) to allow any residual gas under the heatsink 140 to escape as the heatsink rim 146 is lowered into the trench 160. The aperture can be formed in the heatsink rim 146, the heatsink body 144 of FIG. 1, or a combination thereof. For example, the aperture can be formed along a side of the heatsink rim 146, at the joint between two of the trench segment 402 of FIG. 4, or at the heatsink inner surface 142 of FIG. 1.

The heatsink rim 146 can prevent excess thermal interface material from escaping from under the heatsink 140. The adhesive layer 130 can be used to control the vertical position of the heatsink 140 and the heatsink rim 146. The heatsink 140 can be electrically isolated from the integrated circuit 120 and the substrate 102.

The heatsink rim 146 can be formed in a variety of ways. For example, the heatsink rim 146 can be beveled to allow easier insertion into the trench 160. The heatsink rim 146 can be narrower than the width of the trench 160 to allow easier insertion into the trench 160.

In another example, the heatsink rim 146 can include openings in the heatsink rim 146 to allow residual gas to escape. In yet another example, the heatsink rim 146 can be a continuous structure.

The heatsink inner surface 142 can be directly on the thermal interface material layer 132. The heatsink inner surface 142 can be facing the device inactive side 182. In an illustrative example, the heatsink inner surface 142 can be facing the device active side 180 of FIG. 1.

It has been discovered that forming the trench 160 around the integrated circuit 120 and mounting the heatsink 140 in the trench 160 provides improved reliability and improved thermal dissipation. Mounting the heatsink 140 in the trench 160 aligns the heatsink 140 over the integrated circuit 120 to minimize the distance between the entire surface of the integrated circuit 120 and the heatsink inner surface 142 and maximizes the heat transfer from the integrated circuit 120 and the heatsink 140.

Figure 12:
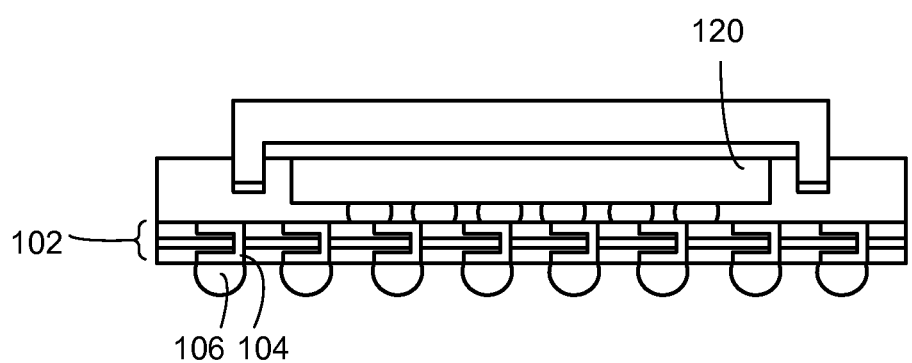
FIG. 12 is the structure of FIG. 1 in a connecting phase of manufacture.

Referring now to FIG. 12, therein is the structure of FIG. 1 in a connecting phase of manufacture. The connecting phase can include a connecting method for connecting the external interconnects 106 to the substrate 102. The external interconnects 106 can be attached to the substrate interconnects 104 to allow the integrated circuit 120 to couple to external systems (not shown).

Figure 13:
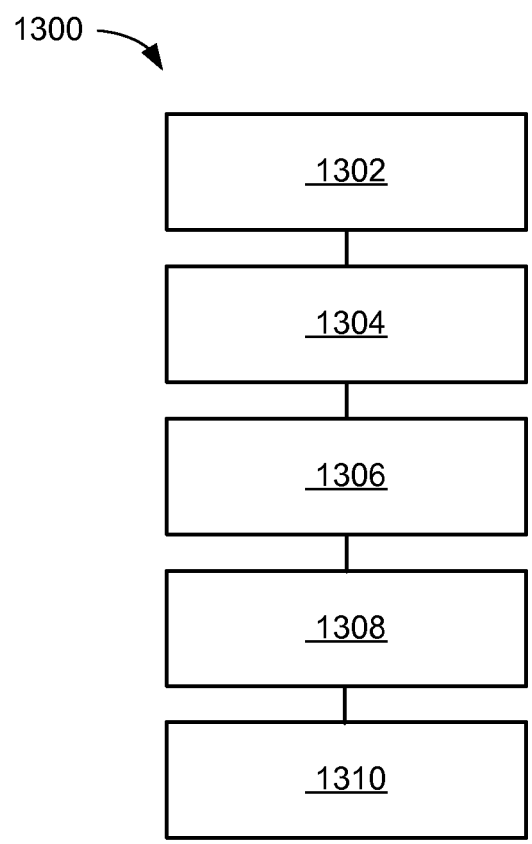
FIG. 13 is a flow chart of a method of manufacture of the integrated circuit packaging system of FIG. 1 in a further embodiment of the present invention.

Referring now to FIG. 13, therein is shown a flow chart of a method 1300 of manufacture of the integrated circuit packaging system 100 of FIG. 1 in a further embodiment of the present invention. The method 1300 includes: providing a substrate in a block 1302; attaching an integrated circuit to the substrate in a block 1304; molding an encapsulation directly on the integrated circuit and the substrate in a block 1306; forming a trench in the encapsulation having a trench bottom surface and surrounding the integrated circuit in a block 1308; and mounting a heatsink having a heatsink rim over the integrated circuit with the heatsink rim within the trench and the heatsink electrically isolated from the substrate in a block 1310.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. An integrated circuit packaging system comprising:
   a substrate;
   an integrated circuit attached to the substrate;
   an encapsulation molded directly on the integrated circuit and the substrate with the encapsulation having a trench with a trench bottom surface and the trench surrounding the integrated circuit and a device inactive side of the integrated circuit exposed from the encapsulation with the device inactive side coplanar with an encapsulation top side; and
   a heatsink having a heatsink body and a heatsink rim extending downward below the heatsink body, the heatsink mounted over the integrated circuit with the heatsink rim within the trench.

2. The system as claimed in claim 1 wherein the heatsink includes:
   the heatsink rim attached to the trench bottom surface;
   the heatsink having a heatsink inner surface attached to the integrated circuit; and
   further comprising:
   an adhesive layer between the heatsink rim and the trench bottom surface, and
   a thermal interface material layer between the heatsink inner surface and the integrated circuit.

3. The system as claimed in claim 1 wherein the encapsulation includes the trench having debris characteristic of laser etching.

4. The system as claimed in claim 1 wherein the encapsulation includes the trench having scratches characteristic of sawing.

5. The system as claimed in claim 1 further comprising connecting an external interconnect to the substrate interconnect.

6. The system as claimed in claim 5 wherein the encapsulation includes the trench having a molded surface characteristic of molding.

7. The system as claimed in claim 5 wherein the encapsulation includes the trench having a trench depth less than a device height of the integrated circuit.

8. The system as claimed in claim 5 further comprising a thermal interface material layer directly on a device inactive side and an encapsulation top side.

9. The system as claimed in claim 5 further comprising a trench segment of the trench aligned with a horizontal side of the integrated circuit.

* * * * *